United States Patent [19]

Fukunaga

[11] 4,255,005
[45] Mar. 10, 1981

[54] ELECTRICAL CONNECTOR ASSEMBLY

[75] Inventor: Yukio Fukunaga, Yokohama, Japan

[73] Assignee: Nissan Motor Company, Limited, Yokohama, Japan

[21] Appl. No.: 43,685

[22] Filed: May 30, 1979

[30] Foreign Application Priority Data

Jun. 2, 1978 [JP] Japan .................. 53-66978

[51] Int. Cl.³ .......................................... H05K 1/12
[52] U.S. Cl. ........................ 339/17 C; 339/125 R; 339/128; 339/176 MF
[58] Field of Search .............. 339/17 C, 17 F, 17 LC, 339/17 LM, 17 M, 17 R, 17 L, 126 R, 176 MF, 176 MP, 125 R, 128; 361/395, 398, 399, 412-415

[56] References Cited

U.S. PATENT DOCUMENTS

| | | | |
|---|---|---|---|
| 3,721,941 | 3/1973 | Wisser | 339/126 R |
| 3,910,664 | 10/1975 | Pauza et al. | 339/176 MP |

FOREIGN PATENT DOCUMENTS

| | | | |
|---|---|---|---|
| 1233038 | 1/1967 | Fed. Rep. of Germany | 361/412 |
| 1147335 | 4/1969 | United Kingdom | 339/17 M |

OTHER PUBLICATIONS

Solutions to Interconnection Problems, Sanders Assoc. Electronic Design, p. 93, 7-1966.

*Primary Examiner*—Neil Abrams
*Attorney, Agent, or Firm*—Lane, Aitken, Ziems, Kice & Kananen

[57] ABSTRACT

An electrical connector assembly for providing electric connections to an assembly of a plural number of electrically operating instruments which are to be mounted jointly in a predetermined position on a panel structure like an instrument panel of a motor vehicle. The connector assembly employs a printed wiring plate common to the respective electric instruments, the printed wiring plate having foil terminals aligned on opposite sides of an aperture which receives foot portions of terminal elements of a mating member which is engageable with a complementary mating member on the part of the electric instrument assembly.

4 Claims, 9 Drawing Figures

ELECTRICAL CONNECTOR ASSEMBLY

FIELD OF THE INVENTION

This invention relates to electrical connectors, and more particularly to an electrical connector assembly which facilitates mounting of electric instruments on a vehicular instrument panel or a like structure.

BACKGROUND OF THE INVENTION

When mounting various electrically operating instruments such as speedometer, temperature indicator and radio receiver on an instrument panel of a motor vehicle, it is ideal that the setting of the electric instruments in a predetermined position on the panel simultaneously completes its mechanical mounting and necessary electrical connections or wiring.

According to one conventional practice, the wires to be connected to sensors and lamps on the instrument panel are led out of the engine room through the dash lower panel and collected to a junction block, which is located beneath the instrument panel, and then distributed to the respective instruments by means of a number of separate connecting wires or a wire harness or cable assembly binding up a necessary number of connecting wires. The leading ends of the connecting wires are connected to terminal elements of one mating member which is fixed on the panel and which is matingly engageable with another mating member on the part of the electric instruments when the latter are set in position on the panel.

This manner of wiring using separate connecting wires between the junction block and the respective electric instruments is confusing and complicated since a large number of wires jumble together behind the instrument panel or within a limited space between the instrument panel and the vehicle body. On the other hand, the cable assembly makes rattling noises by hitting against the instrument panel or other nearby parts due to mechanical vibrations of the vehicle.

SUMMARY OF THE INVENTION

It is therefore an object of the present invention to provide an electrical connector assembly which facilitates the making of electric connections to a number of electric instruments which are to be mounted jointly within a limited space on a panel structure.

It is a more particular object of the present invention to provide an electrical connector assembly employing a printed wiring plate common to a plural number of electric instruments to be mounted in a pocket which is provided on a vehicular instrument panel to simplify the wiring to the respective instruments.

It is another object of the invention to provide an electrical connector assembly for an electric instrument assembly to be mounted in a pocket on an instrument panel of a motor vehicle, the connector assembly employing a printed wiring plate which is located behind the pocket of the instrument panel and has its foil terminals securely connected to terminal elements of a mating member on the part of the electric instrument assembly.

According to the present invention, an improvement is provided in an electrical connector assembly for electrically connecting an instrument to be mounted on one side of a vehicular instrument panel to an electrical device located on the other side of the panel when the instrument is properly mounted on the panel. The connector assembly includes a socket member arranged on the instrument which member has a number of terminals electrically connected to the instrument. A plug member on the instrument panel has an insulating housing disposed in an opening formed in the instrument panel and a number of terminal elements housed in the housing. Each of the terminal elements has first and second end portions and is arranged in the housing with the second end portion projecting toward the socket member.

The improvement according to the invention comprises a rigid printed wiring plate fixed to the other side of the instrument panel opposite the instrument. Wiring foil strips are located on the plate and are connected to the electric device. The foil strips terminate at predetermined positions near the opening of the instrument panel wherein the terminating ends of the wiring foil strips are respectively and directly connected to the first end portions of the terminal elements on the plug member.

The above and other objects, features and advantages of the invention will become apparent from the following description and the appended claims, taken in conjunction with the accompanying drawings which show by way of example a preferred embodiment of the invention.

DESCRIPTION OF THE PRIOR ART

Prior to describing in detail the construction of the electrical connector assembly of the present invention, explanation of one of the conventional wiring methods for the electrical connections between wires leading from the junction block and an electric instrument assembly mounted on the instrument panel will be made with reference to FIGS. 1A and 1B in order to clarify the invention.

Figures 1A, 1B:
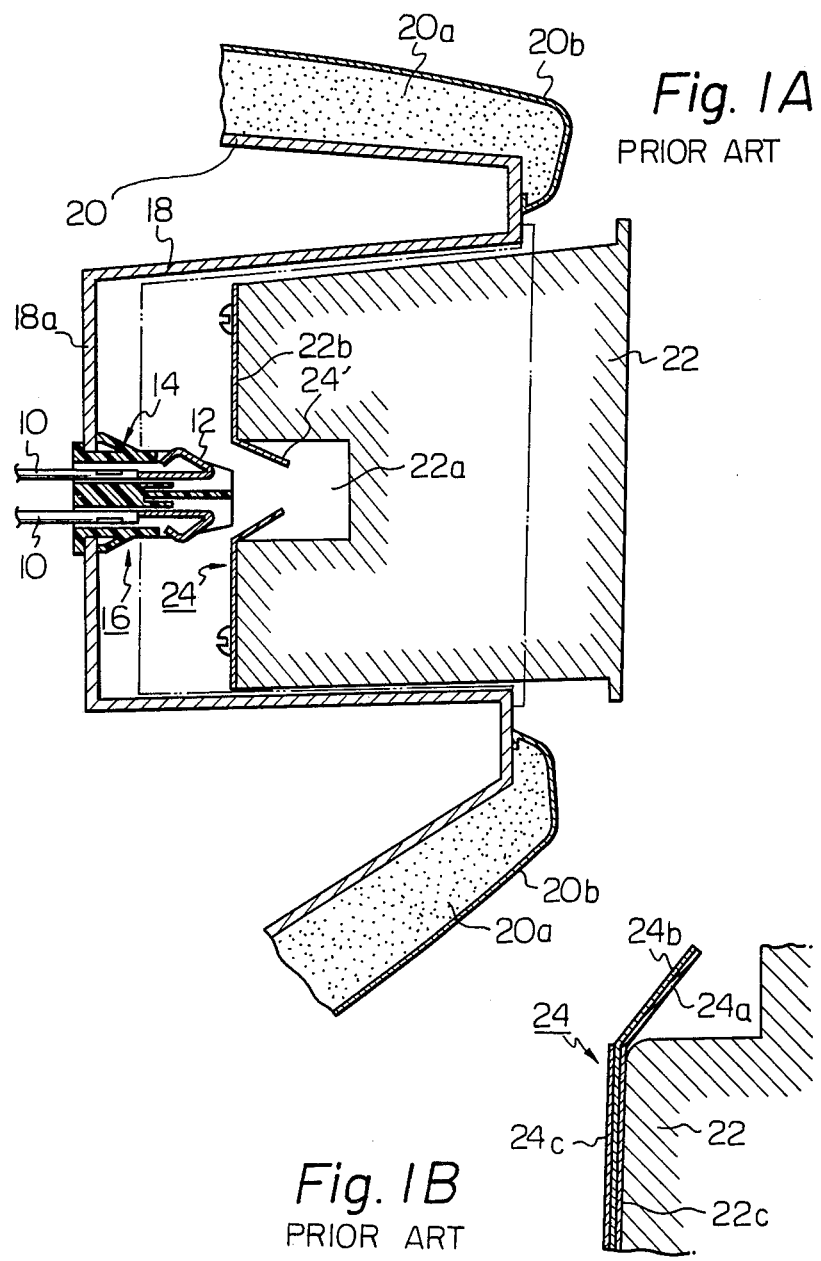
FIGS. 1A and 1B are diagrammatic sectional views illustrative of the conventional manner of wiring for an electric instrument assembly mounted in a pocket on a vehicular instrument panel.

Referring to FIGS. 1A and 1B, there is shown the conventional wiring method, in which the connecting wires 10 from a junction block or electric device 11 are connected to terminal elements 12 wich are accommodated in an insulating housing 14 to constitute a male mating member 16. The insulating housing 14 is fixed on a rear wall 18a of a compartment or pocket 18 in alignment with a female mating member in the form of a socket or receptacle 22a which is provided on the back side of an electric instrument assembly 22 for making engagement with each other. The number of terminals 12 of the male mating member 16 depends on the number of terminals equipped on the electric instrument assembly 22.

The assembly 22 has a printed wiring sheet 24 fixedly mounted on its back side 22b. The sheet 24 is constructed to be flexible so that it may adapt itself to irregular or stepped surfaces which might exist on the back side of the instrument assembly 22. The flexible printed wiring sheet 24 is composed of an insulating base film 24a, an insulating overlay film 24c and a printed wiring of conductive copper foil 24b interposed between the insulating base film 24a and overlay film 24c, as shown particularly in FIG. 1B. The overlay film 24c is removed from those portions of the flexible printed wiring sheet 24 which contain the foil terminals of the printed wiring and which are enfolded into the socket 22a for contacting engagement, upon coupling between the male and female mating members, with the terminal elements 12 of the male mating member 16. The enfolded portion of the flexible printed wiring sheet 24 is designated by reference numeral 24' in FIG. 1A.

Upon inserting the electric instrument assembly 22 into the pocket 18 of the instrument panel 20, the male mating member 16 with the contacting terminal elements 12 is received in the socket 22a of the back of the electric instrument assembly 22, holding therebetween the enfolded portion 24' of the flexible printed wiring sheet 24 with the foil terminals of the printed wiring 24b in contact with the contacting head portions of the terminal elements 12 of the male mating member 16. The electric instrument assembly 22 is fixed in position in the pocket 18 by screws or other suitable fixing means which are not shown.

In FIG. 1A, the reference numerals 20a and 20b designate a pad and a surface material of the instrument panel 20, respectively.

The conventional wiring method described hereinabove requires separate connecting wires or a cable assembly between the junction block and the respective terminal elements 12 of the male mating member 16, resulting in confusingly jumbled connecting wires around the instrument panel 20 or uncomfortable rattling noises made by the cable assembly, as mentioned hereinbefore.

DESCRIPTION OF THE PREFERRED EMBODIMENT

Thus, to eliminate the above-mentioned drawbacks is an essential object of the invention.

Referring to FIGS. 2 to 8, there is illustrated the electrical connector assembly according to the present invention, which employs a rigid printed wiring plate 30 as a substitute for the above-mentioned separate connecting wires 10 (or the wire harness or cable assembly) which complete electrical connection between the junction block and the terminal elements 12. The rigid printed wiring plate 30 is securely mounted on ribs 32 formed on the backside of the rear wall 18a of the pocket 18a of the instrument panel 20. For this, projections 32a of the ribs 32 are inserted into holes 30a provided in the printed wiring plate 30 and snap rings 34 are fitted on the jutted outer ends of the projections 32a. The plate 30 bears the conductive wiring foils 36 on the outer side thereof, that is, on the side facing away from the instrument panel 20. The foils 36 are respectively connected to suitable electric devices 36a, only one of which is shown for convenience.

The printed wiring plate 30 is provided with a rectangular aperture 38 (see FIG. 3) for receiving therein leg portions of a number of terminal elements 40 which are accommodated within passages formed in an insulating housing 44. A pair of locking holes 46 are provided in the outer sides of the opposite ends of the aperture 38 for engagement with hook ends of locking arms of the insulating housing 44 which will be described in detail hereinlater. The plate 30 is further provided with notches 48 in the marginal edge portions which define the opposite ends of the rectangular aperture 38, for engagement with positioning tabs 50 on the insulating housing 44.

Figure 2:
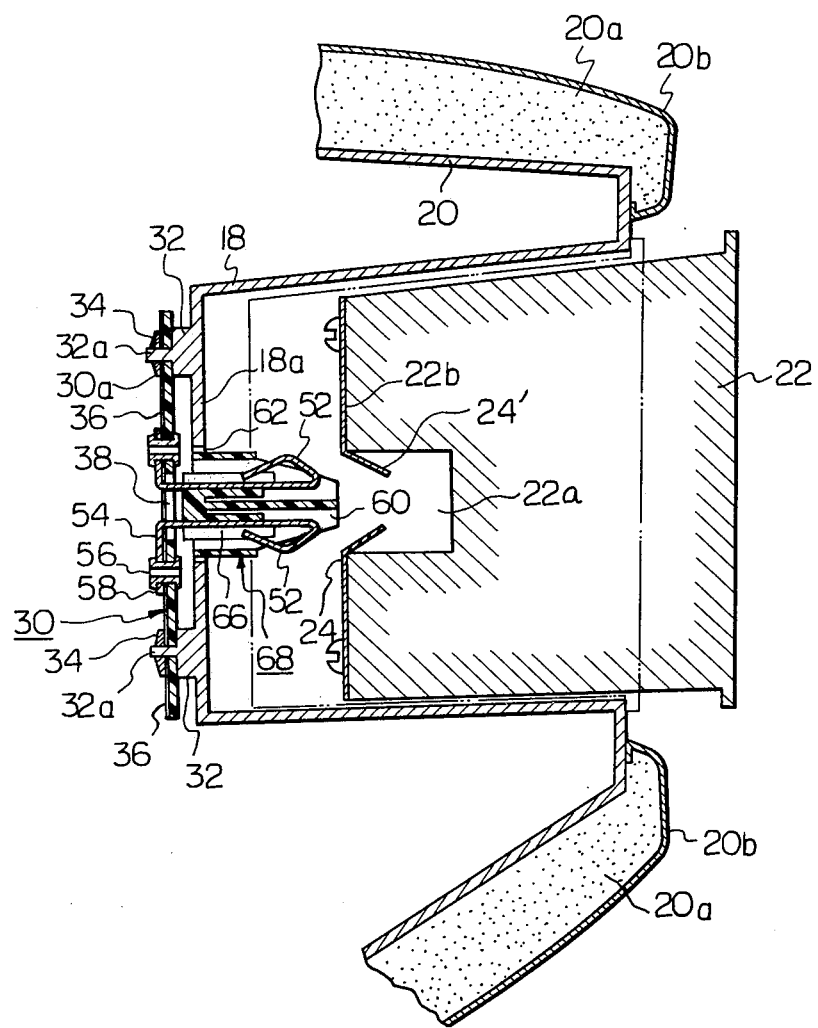
FIG. 2 is a diagrammatic sectional view of a connector assembly according to the present invention.
Figure 3:
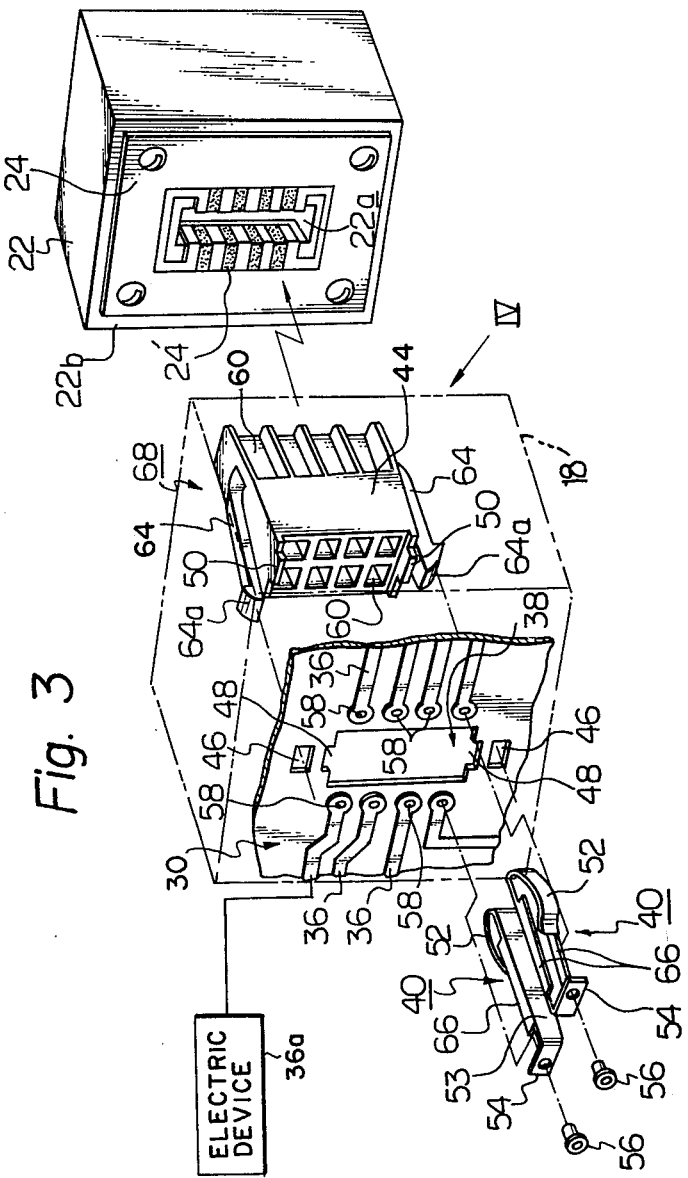
FIG. 3 is an exploded view of the connector assembly of FIG. 2.
Figure 5:
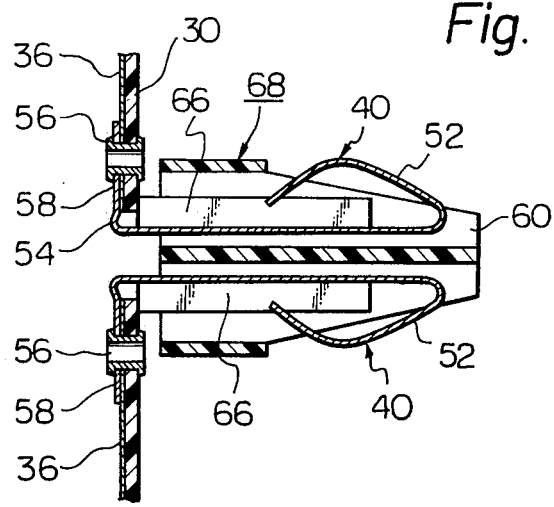
FIG. 5 is a sectional view taken on line V—V of FIG. 4.

Each terminal element 40 is formed from a strip of conductive material and has a resiliently folded contacting head portion 52, a perpendicularly bent foot portion 54 and an elongated leg portion 53, as shown. The foot portions 54 of the terminal elements 40 are fixed to foil terminals of the printed wiring plate 30 by grommets 56 which are secured in eyelet holes 58 at the foil terminals aligned on opposite sides of the aperture 38, as shown in FIGS. 2 and 5. Instead of using the grommets 56, the foot portions 54 of the terminal elements 40 may be soldered to the respective foil terminals of the printed wiring plate 30 if desired.

The insulating housing 44 which accommodates the terminal elements symmetrically in two rows of passages 60 has a rear end portion fitted into a rectangular aperture 62 (see FIG. 2) which is formed in the rear end wall 18a of the pocket 18, with the positioning tabs 50 of the housing 44 in engagement with the notches 48 of the printed wiring plate 30, so that the rear open ends of the passages 60 are disposed in alignment with the rectangular aperture 38. The insulating housing 44 is fixed in this position by a pair of locking arms 64 which extend obliquely rearward from opposite end walls of the housing 44, the hook portions 64a at the distal ends of the locking arms 64 lockedly engaging the locking holes 46 of the printed wiring plate 30.

Figure 4:
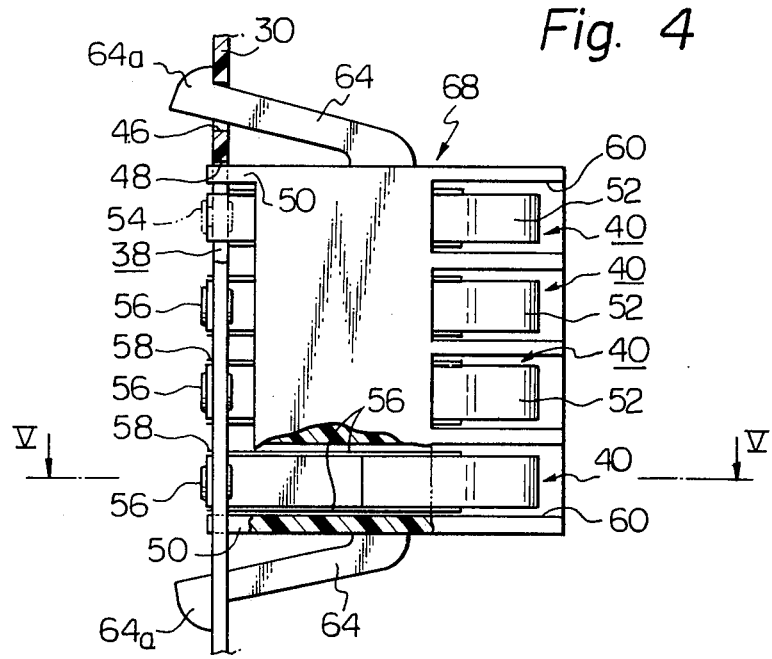
FIG. 4 is a side view of the male mating member as seen in the direction of arrow IV of FIG. 3.

Under this condition just described, the terminal elements 40 are inserted into the respective passages 60 of the insulating housing 44, permitting the terminal elements 40 to take the position shown in FIGS. 4 and 5, with the resiliently looped contacting head portions 52 saliently exposed through the openings at the front ends of the passages 60, as is well understood from FIGS. 4 and 5. Each terminal element 40 is provided with reinforcing flange portions 66 along opposite sides thereof.

The insulating housing 44 and terminal elements 40 thus constitute a male member 68. The male member 68 is mateable with the female or socket member 22a which is provided on the backside of the electric instrument assembly 22. The socket 22a has a dimension matching that of the male member 68 and receives the enfolded foil terminals of the flexible printed wiring sheet 24 on its opposing interior wall surfaces which engage the contacting head portions 52 of the terminal elements 40 of the male member 68 in the same manner as in FIG. 1A.

The male member 68 which has been assembled in this manner presents substantially the same appearance as the male member 16 of FIG. 1A. Upon fitting the electric instrument assembly 22 into the pocket 18 of the instrument panel 20, the male and female members are mated with each other to connect the terminals of the electric instrument assembly 22 with the terminals of the printed wiring plate 30 through the terminal elements 40.

Figure 6:
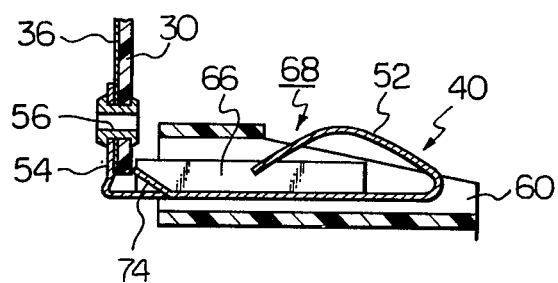
FIGS. 6 through 8 are diagrammatic sectional views showing various modifications of stopper means for the contacting terminal elements of the male mating member.
Figure 7:
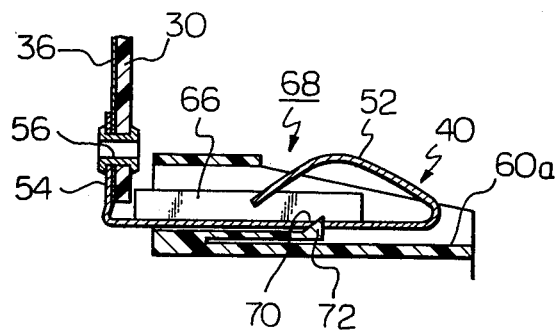
Figure 8:
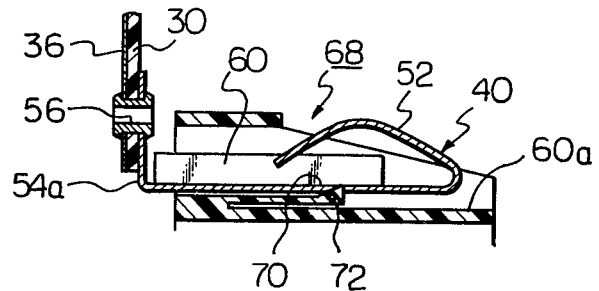

FIGS. 6 to 8 show different forms of stop means which blocks displacements of the terminal elements 40 toward the rear ends of the passages 60 of the insulating housing 44. The stop means serves to prevent the damages which would otherwise be caused to the grommets 56 when an external force is imposed on the terminal element 40. In FIGS. 7 and 8, the terminal element 40 is provided with a rectangular aperture 70 in its middle portion for engagement with a resilient claw 72 which is provided on the bottom wall 60a of the passage 60. The terminal element 40 of FIG. 6 is provided with a lancing 74 which is abutted against the inner side of the printed wiring plate 30. In FIG. 8, the foot 54a of the terminal element 40 is secured to the inner side of the printed wiring plate 30 and connected to the foil terminal on the other side of the plate 30 through the grommet 56. If desired, the printed wiring plate 30 may be mounted in such a manner as to have the wiring foils 36 on the inner side facing the backside of the rear end wall 18a of the mounting pocket 18 of the panel 20.

What is claimed is:

1. In a vehicular instrument panel assembly including an instrument panel having on one side thereof a pocket, an instrument to be mounted in said pocket, an electric device located at the other side of said instrument panel, and an electrical connector assembly by which said instrument and said electrical device are brought into electrical connection when said instrument is properly mounted in said pocket, said connector assembly including a socket member arranged on said instrument and having a number of terminals electrically connected to said instrument, a plug member arranged on said instrument panel and having an insulating housing disposed in an opening formed in the bottom wall of said pocket and a number of terminal elements housed in said housing, each of said terminal elements having opposed first and second end portions and being arranged in said housing with said second end portion projecting into said pocket so that when said instrument is properly mounted in said pocket, said second end portions of said terminal elements are brought into contact with the terminals of said instrument accomplishing the electrical connection therebetween, the improvement comprising a rigid printed wiring plate mounted on a rear end wall of said pocket, said plate having therein an aperture aligned with said opening of the bottom of said pocket and having thereon wiring foil strips which are connected to said electric device and terminate near the aperture of the wiring plate to surround the same, said first end portions of said terminal elements extending through said aperture of said wiring plate to be respectively and directly connected to the terminating ends of said wire foil strips, said insulating housing of said plate member being fixed in an aligned position relative to said aperature of said printed wiring plate by means of a pair of locking arms extending from opposite end walls of said insulating house, said locking arms having hooked ends which are engageable with locking holes formed in said printed wiring plate beside said aperture.

2. The improvement as claimed in claim 1, in which said printed wiring plate is fixedly mounted on ribs which are provided on said rear end wall of said pocket.

3. In a vehicular instrument panel assembly including an instrument panel, an instrument to be mounted on one side of said instrument panel, an electric device located at the other side of said instrument panel, and an electrical connector assembly by which said instrument and said electrical device are brought into electrical connection when said instrument is properly mounted on said instrument panel, said connector assembly including a socket member arranged on said instrument and having a number of terminals electrically connected to said instrument, a plug member arranged on said instrument panel and having an insulating housing disposed in an opening formed in the insulating panel and a number of terminal elements housed in said housing, each of said terminal elements having opposed first and second end portions and being arranged in said housing with said second end portion projecting toward said socket member so that when said instrument is properly mounted on said instrument panel, said second end portions of said terminal elements are brought into contact with the terminals of said instrument accomplishing the electrical connection therebetween, the improvement comprising a rigid printed wiring plate mounted on the other side of said instrument panel, said plate having therein an aperture aligned with said opening of the instrument panel and having thereon wiring foil strips which are connected to said electric device and terminate near the aperture of the wiring plate to surround the same, said first end portions of said terminal elements extending through said aperture of said wiring plate to be respectively and directly connected to the terminating ends of said wiring foil strips, said insulating housing being provided with positioning tabs at the rear end facing said aperture of said printed wiring plate, said positioning tabs being engageable with notches provided in the marginal edge portions at opposite ends of said aperture.

4. In a vehicular instrument panel assembly including an instrument panel, an instrument to be mounted on one side of said instrument panel, an electric device located at the other side of said instrument panel, and an electrical connector assembly by which said instrument and said electrical device are brought into electrical connection when said instrument is properly mounted on said instrument panel, said connector assembly including a socket member arranged on said instrument and having a number of terminals electrically connected to said instrument, a plug member arranged on said instrument panel and having an insulating housing disposed in an opening formed in the insulating panel and a number of terminal elements housed in said housing, each of said terminal elements having opposed first and second end portions and being arranged in said housing with said second end portion projecting toward said socket member so that when said instrument is properly mounted on said instrument panel, said second end portions of said terminal elements are brought into contact with the terminals of said instrument accomplishing the electrical connection therebetween, the improvement comprising a rigid printed wiring plate mounted on the other side of said instrument panel, said plate having therein an aperture aligned with said opening of the instrument panel and having thereon wiring foil strips which are connected to said electric device and terminate near the aperture of the wiring plate to surround the same, said first end portions of said terminal elements extending through said aperture of said wiring plate to be respectively and directly connected to the terminating ends of said wiring foil strips, stopper means being provided for preventing said terminal elements of said plug member from dislocation toward the rear ends of passages of said insulating housing, said stopper means comprising a lancing formed in each terminal element close to said first end portion thereof, said lancing being abutted against the inner side of said printed wiring plate.

* * * * *